United States Patent [19]

Weger

[11] Patent Number: 5,374,786

[45] Date of Patent: Dec. 20, 1994

[54] CERAMIC WALL HYBRID PACKAGE WITH WASHER AND SOLID METAL THROUGH WALL LEADS

[75] Inventor: William C. Weger, Wylie, Tex.

[73] Assignee: Texas Instruments Incorporated, Dallas, Tex.

[21] Appl. No.: 210,640

[22] Filed: Mar. 18, 1994

Related U.S. Application Data

[63] Continuation of Ser. No. 990,863, Dec. 15, 1992, abandoned.

[51] Int. Cl.⁵ .................. H01L 23/02; H01B 17/26; H01R 43/04
[52] U.S. Cl. ................ 174/52.4; 174/152 GM; 257/698; 29/842; 29/862
[58] Field of Search ............. 174/52.1, 52.2, 52.4, 174/52.3, 151, 152 GM; 257/690, 693–695, 698–699, 700; 29/837, 842, 862, 857

[56] References Cited

U.S. PATENT DOCUMENTS

| | | | |
|---|---|---|---|
| 2,089,541 | 8/1937 | Dällenbach | 174/152 GM |
| 2,373,720 | 4/1945 | Stupakoff | 174/152 GM |
| 2,866,929 | 12/1958 | Cooper | 257/698 |
| 3,539,704 | 11/1970 | Sator et al. | 257/698 |
| 4,217,137 | 8/1980 | Kraska et al. | 174/152 GM |
| 4,352,714 | 10/1982 | Patterson | 174/152 GM |
| 4,453,033 | 6/1984 | Duff et al. | 257/698 |
| 4,493,378 | 1/1985 | Kyle | 174/152 GM |

FOREIGN PATENT DOCUMENTS

| | | | |
|---|---|---|---|
| 2556123 | 6/1985 | France | 174/152 GM |

*Primary Examiner*—Leo P. Picard
*Assistant Examiner*—Bot Ledynh
*Attorney, Agent, or Firm*—René E. Grossman; Richard L. Donaldson

[57] ABSTRACT

A package for electrical circuitry and method of making same wherein the package is provided with apertured ceramic side walls. Ceramic layers, which have been previously co-fired together and have an aperture therethrough for receiving a copper-based lead, are positioned in each of the apertures along with a copper-based lead. A Kovar braze washer, which has an aperture therein having approximately the same dimensions as the outside dimensions of the lead is positioned over the lead and against the ceramic layers and brazed to these layers and the lead to provide an hermetic seal. A good electrical conductor is then brazed to the portion of the lead extending external to the package.

22 Claims, 1 Drawing Sheet

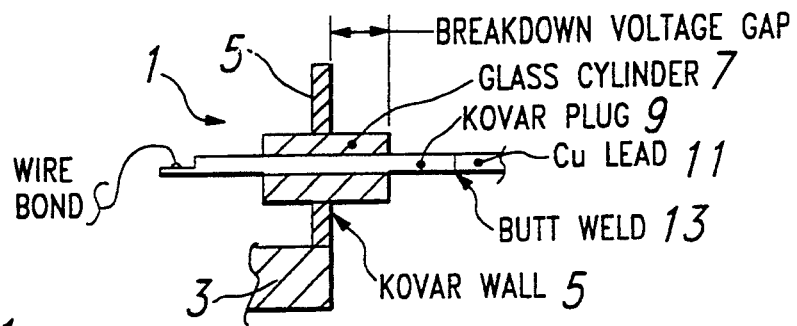
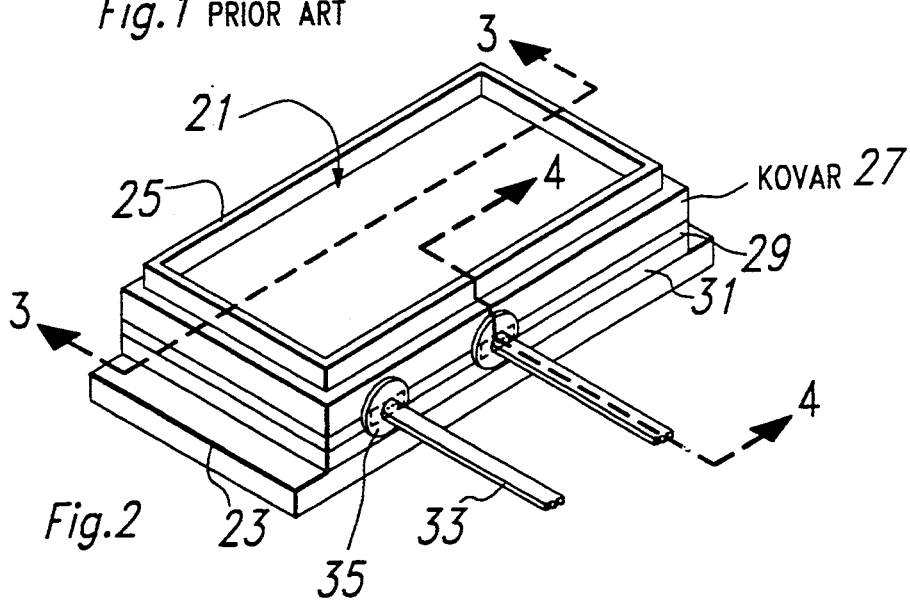
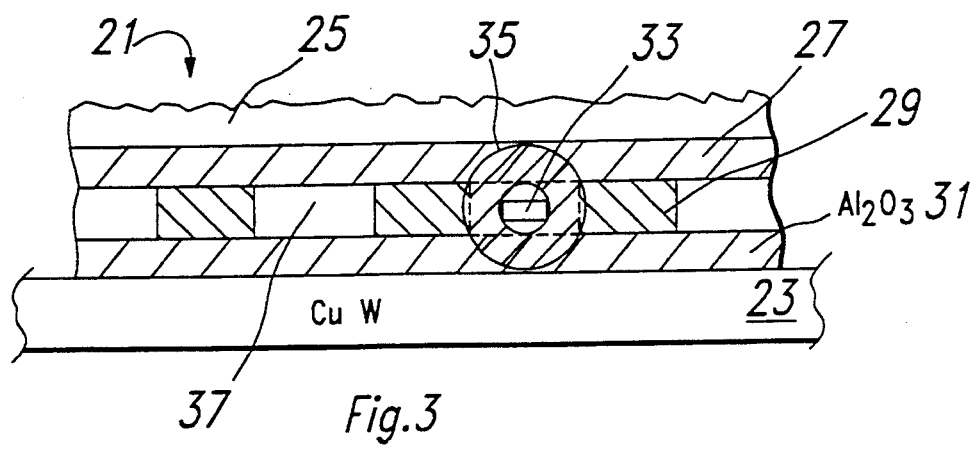
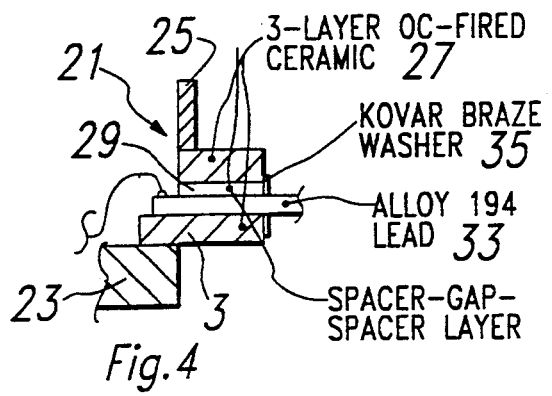

CERAMIC WALL HYBRID PACKAGE WITH WASHER AND SOLID METAL THROUGH WALL LEADS

This application is a continuation application of prior application Ser. No. 07/990,863, filed Dec. 15, 1992 which is now abandoned.

BACKGROUND OF THE INVENTION

1. Field of the Invention

This invention relates to feedthroughs for use in conjunction with packages for electrical components.

2. Brief Description of the Prior Art

Existing metal wall packages are very limited for low profile high, efficiency, high frequency packaging. No hermetic power package exists on the market today for high frequency (>200 KHz) switch-mode power application.

The only hermetic power packages in production are constructed using metal walls with glass or ceramic feed-throughs with round metal leads. Packages such as TO-3, TO-254, TO-258 and multi-leaded hybrids of the same construction are extremely limited for today's high frequency, high efficiency and high density power requirements. The main limitations of standard glass to metal seals are:

1. Power loss due to high AC and DC lead resistance. (All glass seals require round Kovar or clad Kovar leads which have high electrical resistivity). Glass requires a thermal expansion matched material like Kovar to survive temperature extremes.

2. Eddy current loss due to the metal wall and metal leads. (eddy currents are induced in the metal wall around the sealed lead).

3. Round lead limitations at high frequencies. (Skin effect degrades the upper frequency limit).

4. Voltage breakdown and corona problems between leads and case due to the small glass seal diameters.

5. Weight problems with tall Kovar seal rings.

SUMMARY OF THE INVENTION

The above noted problems encountered with prior art devices is materially reduced by the subject invention.

In accordance with the present invention, there is provided a power hybrid electronic package having flat copper alloy leads hermetically sealed in and passing through a ceramic wall of the package. The construction includes a metal base with a ceramic side wall having apertures therein and three co-fired ceramic layers that make up the hybrid package wall disposed in the apertures. Copper alloy leads protrude directly through the apertures in the ceramic wall and through the co-fired ceramic layers. Hermeticity is accomplished by brazing a Kovar washer to the lead and to the outside ceramic wall, much like a standard side braze package. The package uses flat, low resistance alloy leads hermetically sealed in and passing through a ceramic wall making a low profile hybrid with improved dielectric breakdown capabilities and increased current/power handling capabilities and high frequency operation compared with standard glass to metal sealed hybrids. Glass to metal hybrid seals (i.e., kovar-glass-kovar) are eliminated in favor of copper or copper alloy to ceramic seals. The unique design and process steps allow two thermal expansion mismatched materials, copper alloy and ceramic, to be hermetically joined and survive under present day military temperature ranges.

The power hybrid package of the present invention is constructed using a metal base. The construction requires three co-fired ceramic wall layers, a Kovar seal ring and solid through-the-wall flat metal leads. A unique part of the package is the solid through-the-wall leads. The leads are constructed using copper alloy to match the coefficient of thermal expansion of the ceramic wall layers as closely as possible, though not necessarily very closely, while providing low resistivity, preferably alloy 194, which is lower in resistance by more than an order of magnitude than the conventional lead materials used in feedthroughs in conjunction with glass-to-metal seals. The leads are flat, of generally rectangular shape, with a height dimension substantially less than the width dimension for reduced skin effect in high frequency applications and ease of soldering to printed circuit boards. Solid through-the-wall leads are accomplished by placing slots in the center layer of ceramic. Hermeticity is accomplished by brazing a washer having substantially the same coefficient of thermal expansion as the as the co-fired ceramic wall layers and preferably a Kovar washer to the lead (the alloy lead narrows as it passes through the washer). The Kovar washer is then brazed to the outside of the three layers of co-fired ceramic using the same type process used in the manufacture of side-braze packages.

The ceramic wall hybrid in accordance with the present invention allows use of a ceramic wall, eliminating eddy current losses with acceptable package dielectric voltage breakdown. Process driven limitations of round glass to metal seal leads for rectangular leads with reduced skin effect losses is eliminated. High resistance Kovar leads are eliminated in favor of low resistance copper alloy.

There is provided a bonding shelf to which the feedthrough leads are brazed. The bonding shelf can be replaced by a substrate brazed to the bottom of the package and the feedthrough leads brazed directly to the substrate, thus providing an even more efficient, less expensive design.

The ceramic wall package of the present invention is ideal for multiple lead semiconductor power packages, such as TO-254, TO-257, TO-258 as well as power hybrids.

BRIEF DESCRIPTION OF THE DRAWINGS

FIG. 1 is a cross sectional view of a portion of a prior art package with feedthrough;

FIG. 2 is a perspective view of a package with feedthrough in accordance with the present invention;

FIG. 3 is a view taken along the line 3—3 of FIG. 2; and

FIG. 4 is a view taken along the line 4—4 of FIG. 2.

DESCRIPTION OF THE PREFERRED EMBODIMENT

Referring first to FIG. 1, there is shown a cross section of a portion of a prior art feedthrough for an electronics package using a glass to metal seal. The package 1 includes a bottom portion 3 and side walls 5 having one or more apertures therein, the side walls preferably composed of Kovar. A feedthrough composed of a cylindrical glass seal 7 disposed in each of the apertures with a Kovar lead 9 extending therethrough is provided for interconnection between circuitry within the package 1 and the exterior. Copper leads 11 are butt welded to the Kovar lead 9. The Kovar is utilized because it has a coefficient of thermal expansion similar to that of the glass seal 7. However, since Kovar has a relatively high resistivity, the length of the Kovar lead 9 is made small to add minimum resistance to the circuit. However, this requires an additional step of butt welding the copper lead 11 to the Kovar lead 9 with a butt weld 13.

Referring now to FIGS. 2 to 4, there is shown a package in accordance with the present invention. The package 21 includes a bottom 23 formed of a metal having a coefficient of thermal expansion similar to that of the ceramic side walls 25 and good thermal conductivity, preferably copper-tungsten (010/90) the ceramic side walls being preferably of aluminum oxide ($Al_2O_3$) with one or more apertures in the side walls. Within the apertures are a three layer co-fired ceramic 27, 29 and 31 of aluminum oxide with slots 37 for receiving the layers 27, 29 and 31 after co-firing and a flat copper alloy lead 33 extending through the side wall 25 and the ceramic layers. The lead 33 is preferably formed from alloy 194. A Kovar braze washer 35 is disposed over the lead 33 and is brazed to the side walls of the ceramic layers 27, 29 and 31 to provide the hermetic sealing action. As can be seen in FIG. 3, the layer 29 is formed from a plurality of spaced apart rectangular members with the lead 33 extending through the space between the spaced apart rectangular members.

The feedthrough is fabricated by providing the package 21 with apertured ceramic side walls 25. The ceramic layers 27, 29 and 31, which have been previously co-fired together and have an aperture therethrough for receiving the lead 33, are positioned in each of the apertures along with the copper-based lead 33. The Kovar braze washer 33, which has an aperture therein having approximately the same dimensions as the outside dimensions of the copper-based lead 33 is positioned over the lead and against the ceramic layers 27, 29 and 31 and brazed to these layers and the lead to provide an hermetic seal. A good electrical conductor is then brazed to the portion of the lead 33 extending external to the package 21.

It can be seen that there has been provided a package with sealing at the feedthrough in the side wall which overcomes the problems of the prior art as enumerated hereinabove.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

I claim:

1. A feedthrough for an electronic package comprising:
   (a) a ceramic material having an external wall and an aperture in said ceramic material extending to said external wall;
   (b) a highly electrically conductive lead disposed in and extending through said aperture and externally of said external wall; and
   (c) a washer having substantially the same coefficient of thermal expansion as said ceramic material, disposed around said lead and said aperture and secured to said external wall of ceramic material and to said lead to provide an hermetic seal with said external wall and said lead.

2. The feedthrough of claim 1 wherein said washer is Kovar.

3. The feedthrough of claim 2 wherein said lead is a copper based material.

4. The feedthrough of claim 1 wherein said lead is a copper based material.

5. A feedthrough for an electronic package comprising:
   (a) a layer of aluminum oxide having an external wall and an aperture in said layer extending to said external wall;
   (b) a highly electrically conductive lead disposed in and extending through said aperture and externally of said external wall; and
   (c) a washer having substantially the same coefficient of thermal expansion as said layer disposed around said lead and said aperture and secured to said external wall and to said lead to provide an hermetic seal with said external wall and said lead.

6. The feedthrough of claim 5 wherein said washer is Kovar.

7. The feedthrough of claim 6 wherein said lead is a copper based material.

8. The feedthrough of claim 5 wherein said lead is a copper based material.

9. A feedthrough for an electronic package comprising:
   (a) ceramic material having an aperture therethrough;
   (b) a highly electrically conductive lead disposed in and extending through said aperture; and
   (c) a washer having substantially the same coefficient of thermal expansion as said ceramic material disposed around said lead and secured to said ceramic material to provide an hermetic said with said ceramic material;
   (d) wherein said ceramic material comprises three co-fired ceramic layers disposed one atop the other, the intermediate said ceramic layer having at least one slot therein for receiving said lead.

10. A feedthrough for an electronic package comprising:
    (a) aluminum oxide having an aperture therethrough;
    (b) a highly electrically conductive lead disposed in and extending through said aperture; and
    (c) a washer having substantially the same coefficient of thermal expansion as said ceramic material, disposed around said lead and said aperture and secured to said ceramic material to provide an hermetic seal with said ceramic material;
    (d) said ceramic material comprising three co-fired ceramic layers disposed one atop the other, the intermediate said ceramic layer having at least one slot therein for receiving said lead.

11. A package for electrical components comprising:
    (a) a bottom and a ceramic side walls having at least one aperture therein;
    (b) a feedthrough disposed in a said side wall comprising:
        (i) ceramic material having substantially the same coefficient of thermal expansion as said ceramic side walls and having an aperture therethrough;
        (ii) an electrically conductive lead disposed in and extending through said aperture; and
        (iii) a washer having substantially the same coefficient of thermal expansion as said ceramic material disposed around said lead and secured to said ceramic material to provide an hermetic seal with said ceramic material.

12. The package of claim 11 wherein said ceramic material is aluminum oxide.

13. The package of claim 12 wherein said washer is Kovar.

14. The package of claim 13 wherein said lead is a copper based material.

15. The package of claim 14 wherein said ceramic material comprises three co-fired ceramic layers disposed one atop the other, the intermediate said ceramic layer having at least one slot therein for receiving said lead.

16. The package of claim 12 wherein said lead is a copper based material.

17. The package of claim 11 wherein said washer is Kovar.

18. The package of claim 17 wherein said lead is a copper based material.

19. The package of claim 11 wherein said lead is a copper based material.

20. The package of claim 11 wherein said ceramic material comprises three co-fired ceramic layers disposed one atop the other, the intermediate said ceramic layer having at least one slot therein for receiving said lead.

21. A method of making a feedthrough for a package comprising the steps of:
 (a) providing a package having ceramic side walls, at least one said side wall having an aperture therein;
 (b) disposing in said aperture a ceramic material having substantially the same coefficient of thermal expansion as said ceramic side walls and having an aperture therein;
 (c) disposing a copper-based lead in said aperture in said ceramic material; and
 (d) hermetically securing a washer having substantially the same coefficient of thermal expansion as said ceramic material to said ceramic material.

22. The method of claim 21 wherein said ceramic material is aluminum oxide and said washer is Kovar.

* * * * *